United States Patent
Kimura et al.

(10) Patent No.: US 8,649,173 B2
(45) Date of Patent: Feb. 11, 2014

(54) OPERATION PROCESSOR

(75) Inventors: Shotaro Kimura, Tokyo (JP); Masahiko Usui, Tokyo (JP); Junichi Funatsu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 280 days.

(21) Appl. No.: 13/126,399

(22) PCT Filed: Dec. 2, 2008

(86) PCT No.: PCT/JP2008/071876
§ 371 (c)(1),
(2), (4) Date: Jul. 12, 2011

(87) PCT Pub. No.: WO2010/064299
PCT Pub. Date: Jun. 10, 2010

(65) Prior Publication Data
US 2011/0299240 A1    Dec. 8, 2011

(51) Int. Cl.
*H05K 7/20* (2006.01)

(52) U.S. Cl.
USPC ........ 361/679.5; 361/690; 361/692; 361/695; 361/679.48; 361/679.49

(58) Field of Classification Search
USPC .................. 361/695, 690, 692, 679.48–679.5
See application file for complete search history.

(56) References Cited

U.S. PATENT DOCUMENTS

| | | | |
|---|---|---|---|
| 5,297,005 A * | 3/1994 | Gourdine | 361/697 |
| 5,544,012 A | 8/1996 | Koike | |
| 5,559,673 A * | 9/1996 | Gagnon et al. | 361/695 |
| 5,672,102 A * | 9/1997 | Herald | 454/184 |
| 5,789,007 A * | 8/1998 | Bianco | 426/263 |
| 7,112,131 B2 * | 9/2006 | Rasmussen et al. | 454/184 |
| 7,154,748 B2 * | 12/2006 | Yamada | 361/690 |
| 7,430,117 B2 * | 9/2008 | Shabany | 361/695 |
| 7,593,223 B2 * | 9/2009 | Kobayashi | 361/679.5 |
| 7,604,535 B2 * | 10/2009 | Germagian et al. | 454/184 |
| 7,724,515 B2 | 5/2010 | Fukuda et al. | |
| 7,746,637 B2 * | 6/2010 | Donowho et al. | 361/690 |

(Continued)

FOREIGN PATENT DOCUMENTS

| JP | 56-94099 | 12/1954 |
|---|---|---|
| JP | 56-94099 | 12/1981 |

(Continued)

OTHER PUBLICATIONS

PCT International Search Report on application No. PCT/JP2008/071876 dated Jan. 20, 2009; 2 pages.

*Primary Examiner* — Anatoly Vortman
(74) *Attorney, Agent, or Firm* — Foley & Lardner LLP

(57) ABSTRACT

A fan box is provided with, in addition to an intake port in the front face, a second intake port at a wall surface position upstream of a fan. An Input/output unit disposed above or below the fan box comprises an exhaust notch that is aligned with the second intake port of the fan box, as well as an intake notch that is provided further to the rear than the exhaust notch. The intake notch is in communication with an air duct that opens in the front face of the processor and that leads to a unit box. The fan discharges through an exhaust port cooling wind that has flowed into the first intake port via an operation unit, as well as cooling wind that has flowed into the second intake port via the Input/output unit.

7 Claims, 5 Drawing Sheets

(56) References Cited

U.S. PATENT DOCUMENTS

| | | | |
|---|---|---|---|
| 7,752,858 B2 * | 7/2010 | Johnson et al. | 62/186 |
| 7,813,121 B2 * | 10/2010 | Bisson et al. | 361/679.51 |
| 7,965,504 B2 * | 6/2011 | Hamlin | 361/695 |
| 8,199,500 B2 * | 6/2012 | Yamagiwa | 361/692 |
| 8,223,492 B2 * | 7/2012 | Ji et al. | 361/692 |
| 8,320,121 B2 * | 11/2012 | Bisson et al. | 361/679.51 |
| 8,446,725 B2 * | 5/2013 | Lam et al. | 361/695 |
| 2004/0184233 A1 * | 9/2004 | Yamada | 361/690 |
| 2005/0168945 A1 * | 8/2005 | Coglitore | 361/695 |
| 2007/0274039 A1 * | 11/2007 | Hamlin | 361/695 |
| 2008/0259563 A1 | 10/2008 | Fukuda et al. | |

FOREIGN PATENT DOCUMENTS

| | | |
|---|---|---|
| JP | 3-67490 | 7/1991 |
| JP | 7-202464 | 8/1995 |
| JP | 2001-189584 | 7/2001 |
| JP | 2002-118386 | 4/2002 |
| JP | 2008-269673 | 11/2008 |
| JP | 2010-109205 | 5/2010 |

* cited by examiner

OPERATION PROCESSOR

TECHNICAL FIELD

The present invention relates to an operation processor comprising a fan-based air-cooling mechanism.

BACKGROUND

In the field of operation processors, progresses in semiconductor manufacturing techniques have brought about dramatic advancements in processing performance speed and functionality. On the other hand, in line with downsizing trends, case sizes are decreasing. While functionality has improved and sizes have decreased, power consumption by operation processors has increased, and the amount of heat generated is becoming greater than had been conventional. There is a problem in that, as a common property of semiconductors used in operation processors, their power consumption becomes greater the faster they operate, while they are susceptible to heat and failures increase when they are used under high temperatures. For this reason, in order to advance the high-functionality and size reduction of operation processors, progress in power saving techniques as well as cooling techniques have become indispensible in recent years.

As cooling methods for operation processors, natural cooling using natural circulation of air, and forced cooling in which cooling is performed by rotating a fan to generate a flow of air are common. Natural cooling is a cooling method that has been known for a long time, and while it can be accomplished with a simple mechanism, its cooling effects are limited. Forced cooling is a method in which a wind is generated by rotating a fan to enhance cooling effects. However, to the extent that a fan is required, the mechanism is made more complex.

For operation processors as represented by blade servers, etc., fan-based forced cooling methods are generally used. Such operation processors allow a plurality of operation units and Input/output units, which are cooling targets with built-in heat generating bodies, to be mounted, and comprise a plurality of fan boxes for cooling them. Further, taking serviceability into consideration, a typical structure would have a blade part disposed at the front face of a case, and an Input/output unit and a fan box disposed at the case rear face on top of each other and in parallel. With respect to the cooling method, a method is adopted in which external fresh air is made to hit the blade part with a built-in heat generating body, and the cooling wind that has been discharged after cooling the blade part is made to hit the Input/output unit and is vented from the fan box.

Patent Document 1: JP Patent Publication (Kokai) No. 2001-189584 A

DISCLOSURE OF THE INVENTION

Problems to be Solved by the Invention

In a conventional cooling method, since the cooling wind flowing within a blade server flows while taking heat away from a heat generating body that lies in its flow path, the wind temperature gradually rises due to that heat. Consequently, cooling effects are high at the blade part where fresh air hits, but cooling effects become lower at the Input/output unit where the cooling wind that has taken heat away from the blade part and has risen in temperature hits. In recent years, the heat generation amounts of Input/output units have shown an upward trend, and it has become difficult to perform cooling with the conventional methods.

With respect to operation processors in which a plurality of cooling targets exist, there is a method in which vent holes, ducts, etc., are provided within the processor in order to take in external air whose intake air temperature is low relative to each cooling target. By providing the cooling targets in the intake direction of the fan box, effective cooling becomes possible. However, conventionally, there is only one intake face of the fan box. Furthermore, there are restrictions with respect to the fan box mounting position within the processor. Thus, it is difficult to dispose all cooling targets in the intake direction. As a result, there was a problem in that some of the cooling targets cannot be hit with sufficient cooling wind.

As a method for improving the coolability of a cooling target, one conceivable method is to cool the cooling target by adding a fan near that cooling target. However, in that case, new problems arise such as securing an area for installing the fan, an increase in costs, etc.

An object of the present invention is to provide an operation device comprising a cooling mechanism that is capable of efficiently cooling even a cooling target that is provided to the side of a fan box and in parallel to the fan box without adding a fan.

Means for Solving the Problems

With respect to the present invention, there are provided a vent hole for taking in fresh air for each cooling target, and a fan box comprising a plurality of intake ports. The processor comprises a plurality of flow paths from inlet ports to the fan box, and a cooling target is disposed along each flow path, thereby improving cooling effects for the cooling targets that do not face the intake face of the fan box.

With respect to the present invention, in addition to an intake port in the front face, the fan box is provided with a second intake port at a wall surface position that is upstream of the built-in fan. Unit boxes each having a heat generating body inside, such as Input/output units, etc., disposed adjacent above, below or to the side of the fan box, are provided with exhaust notches, which are aligned with the second intake port of the fan box, and intake notches, which are positioned further to the rear than the exhaust notches. The intake notches are in communication with an air duct that is opened in the front face of the processor and that leads to the unit boxes. The fan of the fan box simultaneously discharges through an exhaust port cooling wind that has flowed into the first intake port via an operation unit as well as cooling wind that has flowed into the second intake port via the Input/output units. Thus, both the operation unit, which is located at the front of the processor, and the unit boxes, which are disposed above or below the fan box at the rear of the processor, are cooled with fresh air.

Air ducts may be provided on both the left and right sides of the operation unit. The intake notches are preferably provided in the side wall of the unit box.

If a plurality of unit boxes are to be so disposed as to be stacked on top of each other, the unit box(es) other than the unit box disposed farthest from the fan box will have notches that are aligned with the exhaust notches of the adjacent unit box. By adopting such a structure, it is possible to vent, from a shared fan box, cooling wind from the plurally stacked unit boxes. In so doing, it is preferable that the positions of the respective exhaust notches of the plurality of unit boxes so disposed as to be stacked on top of each other be linearly aligned in the up/down direction.

In addition, a means, such as a shutter, etc., that regulates the opening area may be provided at the opening of the air duct disposed at the front face of the processor.

Effects of the Invention

According to the present invention, along with a cooling target disposed to the front of a fan box, it becomes possible to efficiently cool a cooling target disposed to the side of the fan box as well. In addition, such problems as increases in costs and securing an area that result from adding a new fan or fan box to the processor do not arise either.

DESCRIPTION OF SYMBOLS

Figure 1:
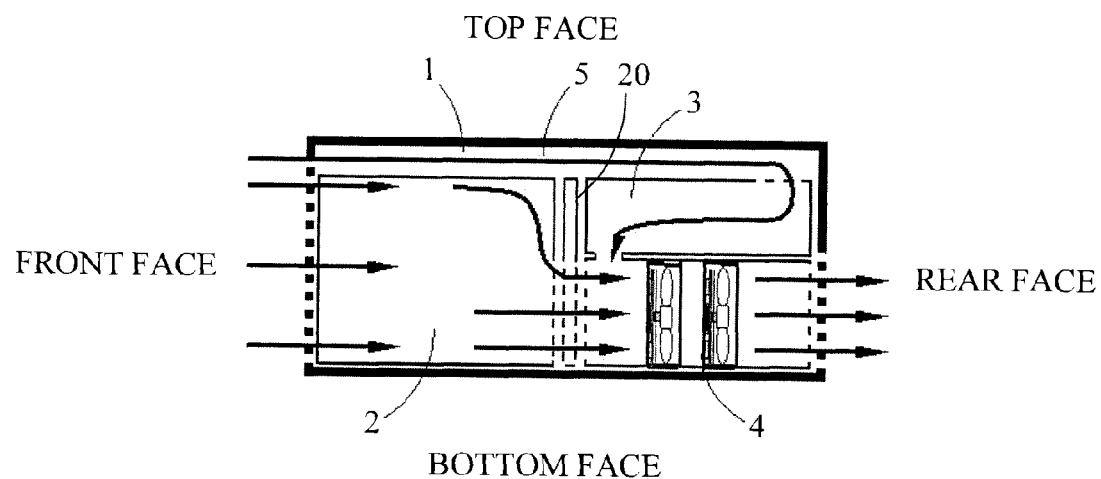
FIG. 1 is a schematic sectional view showing one example of a server device comprising a cooling mechanism according to the present invention.

1 Server device (operation processor)
2 Operation unit
3 Input/output unit
4 Fan box
5 Vent hole
6 Air feeding notch
7 Exhaust notch
8 Heat generating body
9 Front intake port
10 Exhaust port
11 Fan
12 Side intake port
13 Partition plate
14 Vent hole
15 Upper Input/output unit
16 Lower Input/output unit
17 Notch
18 Shutter
19 Fan

DETAILED DESCRIPTION OF EMBODIMENTS OF THE INVENTION

Embodiments of the present invention are described below with reference to the drawings.

FIG. 1 is a schematic sectional view showing one example of a server device (operation processor) 1 comprising a cooling mechanism of the present invention. Here, a flow path, which is provided for cooling wind, of the case is defined as a vent hole. In addition, a slit or a hole, which is provided to allow cooling wind to pass therethrough, of each module mounted on the processor is defined as a notch. However, an exception is made with respect to a fan box with a built-in fan, for which this is defined as being an intake port or an exhaust port. The server device 1 has an operation unit 2, which is a cooling target, disposed on the front face side. The server device 1 adopts a structure in which an Input/output unit 3, which is a unit box that includes a heat generating body inside and that is a cooling target, is disposed on the rear face side, and a fan box 4 for cooling is disposed below and in parallel with the Input/out unit 3. A backplane 20 comprising connectors on its front and reverse sides is disposed between the operation unit 2 on the front face side and the Input/output unit 3 and fan box 4 on the rear face side. The operation unit 2 and the Input/output unit 3 are electrically coupled via the backplane 20. Openings for ventilation are provided in an area of the backplane 20 adjacent to the fan box 4. The fan box 4 may also be a vent hole comprising a fan. The server device 1 comprises, within the case, a vent hole 5 for letting air into the Input/output unit 3. The vent hole 5 comprises a duct structure. The operation unit 2 comprises a structure that allows for internal circulation of cooling wind.

Figure 2:
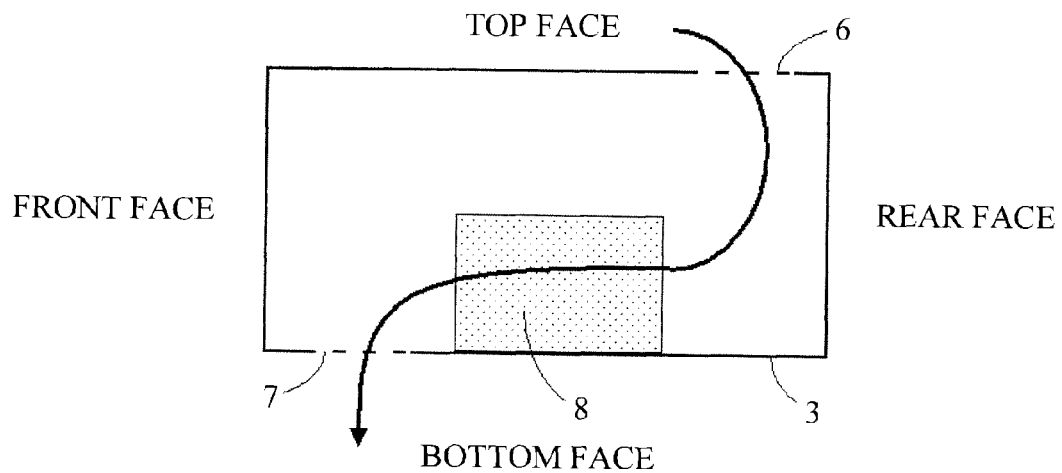
FIG. 2 is a schematic sectional view showing one example of an Input/output unit.

FIG. 2 is a schematic sectional view showing one example of an Input/output unit. The Input/output unit 3 comprises a heat generating body 8 inside. It further comprises air feeding notches 6 for taking in wind, and exhaust notches 7 for venting. The air feeding notches 6 are in contact with the vent hole 5 provided in the case, and the fresh air taken in from the front face of the case is fed to the Input/output unit 3 from the air feeding notches 6 through the vent hole 5. The air feeding notches 6 are provided at positions further towards the rear face than the heat generating body 8. The exhaust notches 7 are provided at positions further towards the front face than the heat generating body 8. Thus, inside the Input/output unit 3, the cooling wind flows from the rear face side to the front face side and cools the heat generating body 8.

Figure 3:
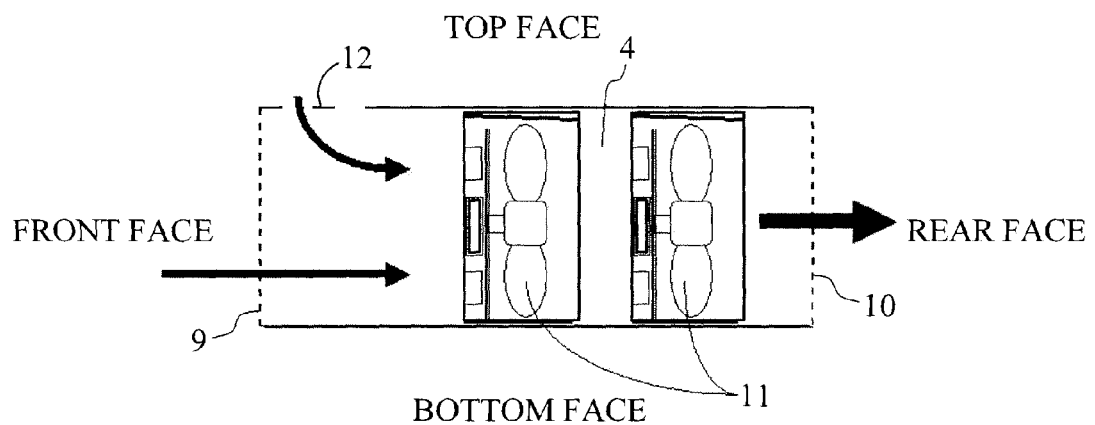
FIG. 3 is a schematic sectional view showing one example of a fan box.

FIG. 3 is a schematic sectional view showing one example of a fan box. The fan box 4 comprises front intake ports 9 in the front face and exhaust ports 10 in the rear face. Fans 11 are provided inside, and as indicated with arrows, the cooling wind sucked in from the intake ports are sent out from the discharge ports. Although the figure shows an example in which two fans are disposed in series, a single fan may be provided instead. In addition, side intake ports 12, as second intake ports for sucking out the exhaust from the Input/output unit 3, are provided in the upper wall of the fan box 4 at positions closer to the front intake ports 9 than the fans 11.

Figure 4:
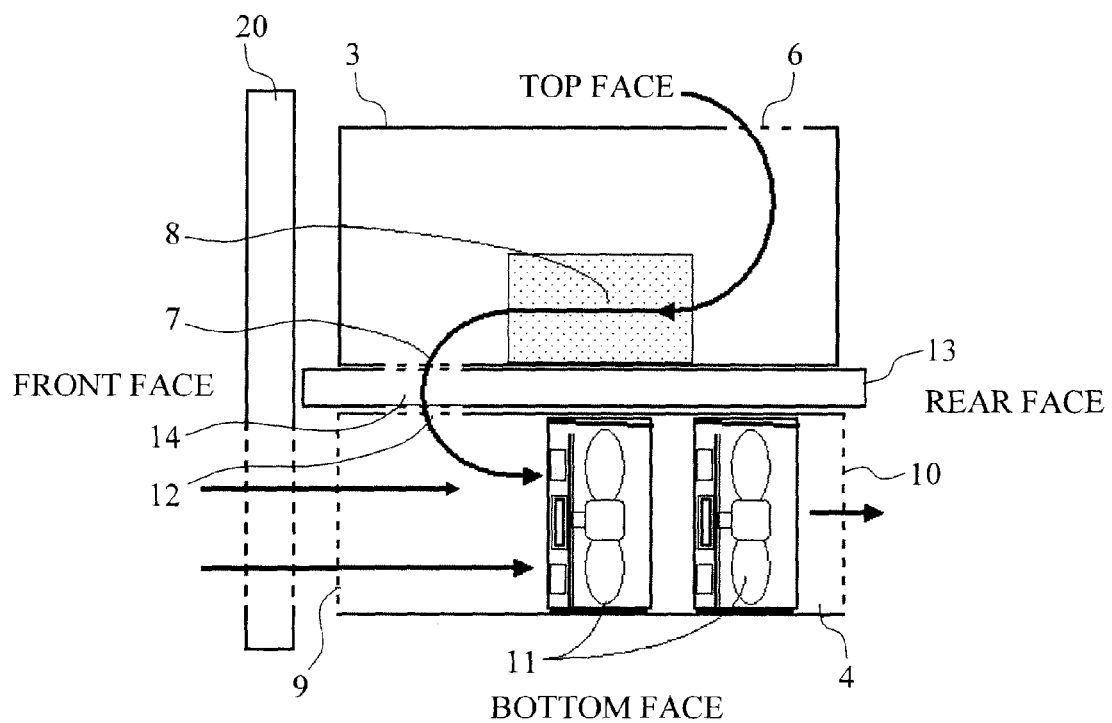
FIG. 4 is a schematic sectional view of an Input/output unit and a fan box.

FIG. 4 is a schematic sectional view of an Input/output unit and a fan box. The Input/output unit 3 and the fan box 4 are provided on the rear face side of the backplane 20. In mounting the Input/output unit 3 and the fan box 4 on the server device, there exists a metal plate 13 for separating the Input/output unit 3 and the fan box 4. The metal plate 13 comprises vent holes 14 so as to connect the exhaust notches 7 of the Input/output unit 3 and the side intake ports 12 of the fan box 4. The exhaust notches 7 of the Input/output unit 3, the side intake ports 12 of the fan box 4, and the vent holes 14 of the metal plate 13 are provided in alignment. Further, in order to efficiently suck wind out from the Input/output unit 3, these are disposed upstream of all of the fans 11 in the fan box 4. Thus, the cooling wind that has cooled the heat generating body 8 inside the Input/output unit 3 is efficiently discharged to the outside of the server device by the fans 11 in the fan box 4.

Next, the flow paths for the cooling wind with respect to the operation unit 2 located to the front of the backplane 20 and the Input/output unit 3 located to the rear of the backplane 20 are described. The operation unit 2, which is a cooling target, in FIG. 1 comprises enough openings for sufficient cooling wind to flow with the front face as intake ports and the rear face, which is adjacent to the fan box 4, as exhaust ports. Thus, by means of the fan box 4 disposed to the rear of the operation unit 2, low-temperature fresh air is taken in from the front face of the operation unit 2. This fresh air, as indicated with arrows in FIG. 1, flows inside the operation unit 2 from the front towards the rear and cools the heat generating body that is inside. Thereafter, it passes through the openings provided in the backplane 20, enters the fan box 4 through the front intake ports 9, and is vented to the outside of the processor by the fans 11.

On the other hand, fresh air of a low intake air temperature that has been taken in from the vent holes 5, which comprise openings in the front face of the processor and which are provided isolated from the compartment where the operation unit 2 is disposed, flows into the Input/output unit 3, which is located on the rear face side of the processor, from the air feeding notches 6. This fresh air, as indicated with arrows in FIG. 1, FIG. 2 and FIG. 4, flows from the rear side of the processor towards the front side and cools the heat generating body that is inside. Thereafter, it flows to the front of the fans 11 from the side intake ports 12 of the fan box 4 that are aligned with the exhaust notches 7, and is vented to the outside of the processor by the fans 11. Thus, the cooling wind whose temperature has risen upon cooling the operation unit 2 does not flow into the Input/output unit 3, and, as in the operation unit 2, fresh air flows in as cooling wind. Consequently, it becomes possible to efficiently cool the Input/output unit 3.

The fan box 4 takes in the exhaust from the operation unit 2 through the front intake ports 9, and takes in the exhaust from the Input/output unit 3 through the side intake ports 12. As indicated by the arrows in FIG. 3, these are vented through the exhaust ports 10 in the rear face by means of the fans 11 inside the fan box 4.

Figure 10:
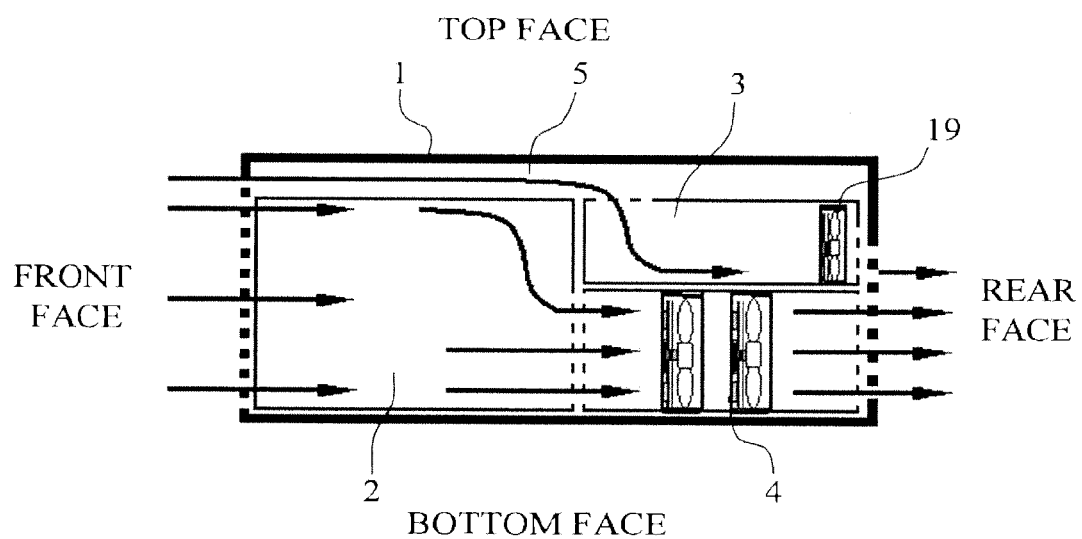
FIG. 10 is a view showing a conventional server cooling structure.

A server cooling structure in which no notches are provided between a fan box and an Input/output unit is shown in FIG. 10. In this case, no flow path exists between the Input/output unit 3 and the fan box 4, and the cooling of the Input/output unit 3 would be perfoiined by additionally providing a fan 19 inside the Input/output unit 3. In contrast, with a method of the present invention, by taking in from the side intake ports 12 in the side face of the fan box 4 the cooling wind from the Input/output unit 3 that does not face the front intake ports 9 of the fans 11, cooling becomes possible without having to add a new fan to the Input/output unit 3.

Figure 5:
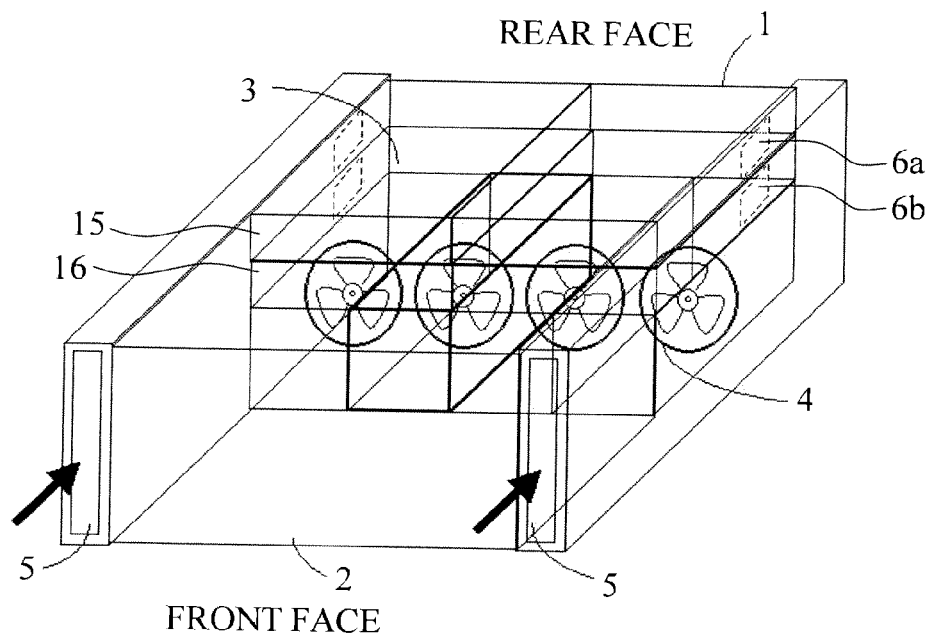
FIG. 5 is a schematic sectional view showing another example of a server device comprising a cooling mechanism according to the present invention.

Next, an embodiment in a case where there are a plurality of cooling targets that do not face the front intake ports of a fan box is explained. FIG. 5 is a schematic sectional view showing another example of a server device comprising a cooling mechanism according to the present invention. The server device in the present example comprises one operation unit, four Input/output units, and four fan boxes. The four Input/output units are so disposed on the fan boxes that two are placed side by side and are so disposed that upper Input/output units 15 and lower Input/output units 16 are stacked on top of each other in two layers in the up/down direction. As in FIG. 1, a backplane for electrical connection is disposed between the operation unit 2 disposed at the front of the processor and the Input/output units 15, 16 and the fan boxes 4 disposed at the rear. However, this is not shown in FIG. 5.

Figure 6:
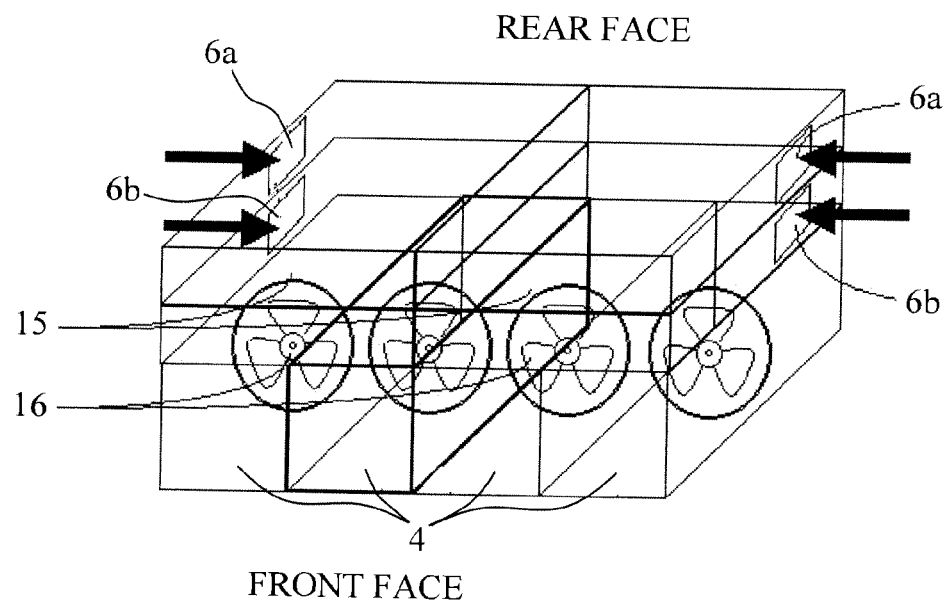
FIG. 6 is a schematic view showing an Input/output unit and a fan box as taken out.
Figure 7:
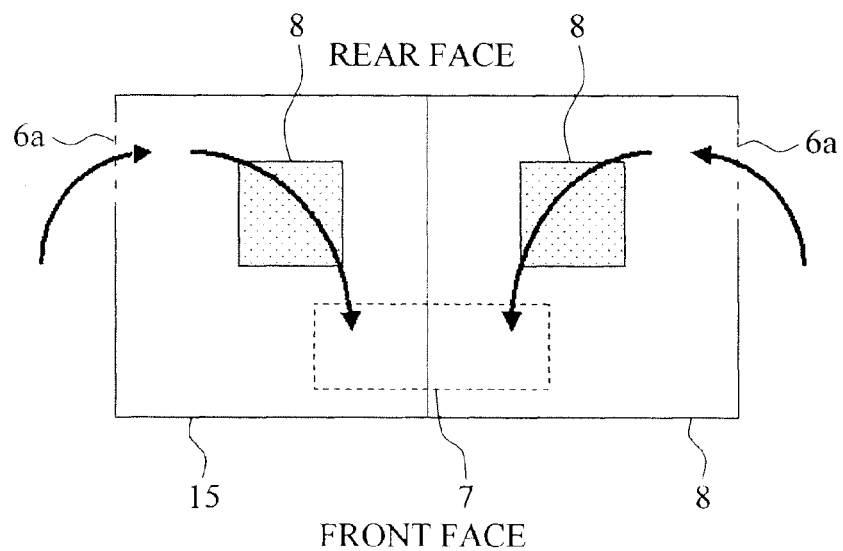
FIG. 7 is a top view of FIG. 6.

Low-temperature fresh air is taken into the operation unit 2 from the front face by the fan boxes 4 disposed in the rear face direction, and the cooling wind that has cooled the heat generating body is vented towards the fan boxes 4. In addition, the vent holes 5 comprise duct structures provided isolated from the compartment for the operation unit 2 and at positions on the left and right thereof, and, as indicated by the arrows in FIG. 5, take in fresh air from the front of the processor. The fresh air that has been taken in from the vent holes 5 is led to the Input/output units 15, 16 as cooling wind of a different system from the cooling wind for the operation unit 2. The respective Input/output units 15, 16 are provided with air feeding notches 6a, 6b in their side walls facing the vent holes 5, and with exhaust notches in their bottom plates. The fresh air intake ports of the vent holes 5 are preferably provided in the front face of the processor. By so doing, fresh air can be readily taken in even in an environment where other operation devices, etc., are disposed in its surroundings. FIG. 6 is a schematic view in which the Input/output units and the fan boxes at the rear face of the processor shown in FIG. 5 are shown as taken out. FIG. 7 is a top view of FIG. 6. In addition, FIG. 8 is a schematic sectional view of FIG. 6.

As the arrows in FIG. 6 indicate, the fresh air taken in from the vent holes 5 flows into the Input/output units 15, 16 via the respective air feeding notches 6a, 6b. As shown in the top view in FIG. 7, the fresh air that has been taken into the upper and lower Input/output units 15, 16 from the air feeding notches 6a, 6b cools the heat generating bodies 8 and is discharged from exhaust notches 7a, 7b. The exhaust notches 7a, 7b are preferably provided at diagonal positions relative to the air feeding notches 6a, 6b so that the cooling wind flows in such a manner as to pass the locations of the heat generating bodies 8.

Figure 8:
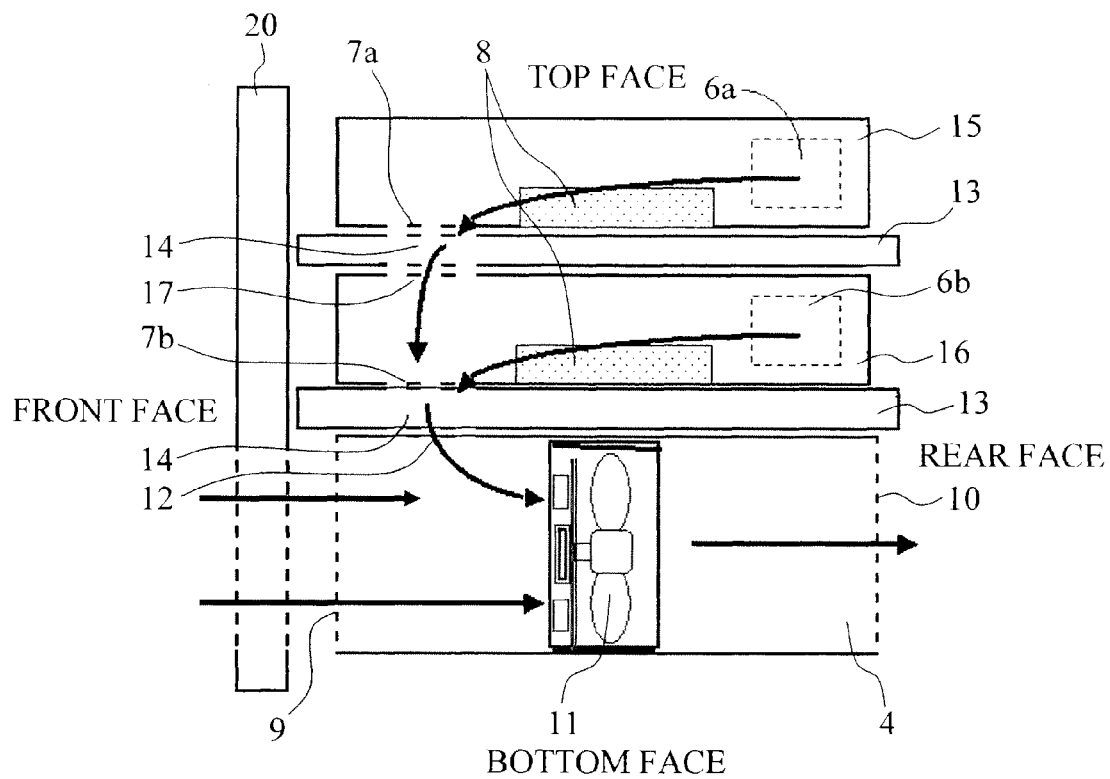
FIG. 8 is a schematic sectional view of FIG. 6.

As shown in FIG. 8, the lower Input/output units 16 comprise, in their top plates, notches 17 for allowing through the cooling wind that has flowed out from the exhaust notches 7a of the upper Input/output units 15. As indicated by the arrows in FIG. 8, the cooling wind that has exited from the exhaust notches 7a of the upper Input/output units 15 passes by the interiors of the lower Input/output units 16 to reach the fan boxes 4. The fresh air that has flowed in from the air feeding notches 6b of the lower Input/output units 16 merges with the cooling wind that has flowed in via the exhaust notches 7a of the upper Input/output units 15, and flows in to the front of the fans of the fan boxes 4 via the exhaust notches 7b of the upper Input/output units 16 and the side intake ports 12 provided in the side walls of the fan boxes 4. The fan boxes 4 take in the exhaust from the operation unit 2 through the front intake ports 9, and they take in the exhausts from the Input/output units 15, 16 through the side intake ports 12. As indicated by the arrows in FIG. 8, these exhausts are vented through the exhaust ports 10 in the rear face by the fans 11 inside the fan boxes 4. The exhaust notches 7a in the bottom plates of the upper Input/output units 15, and the notches 17 in the top plates of as well as the exhaust notches 7b in the bottom plates of the lower Input/output units 16 are preferably arranged so as to be linearly aligned in the up/down direction.

Figure 9:
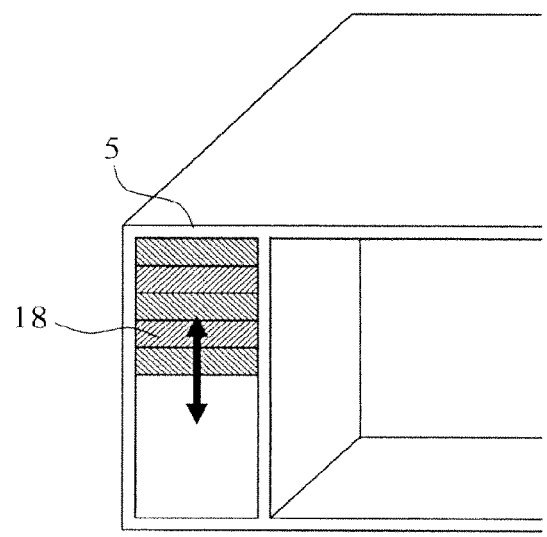
FIG. 9 is a schematic view showing an example of a fresh air inlet port of a vent hole.

FIG. 9 is a schematic view showing an example of a fresh air intake port part of a vent hole located at the front face of a device. By installing on the fresh air intake port of the vent hole 5 a shutter 18 that is capable of regulate the opening area, it becomes possible to regulate the ratio of wind volumes of the cooling winds that flow to the operation unit and the Input/output unit.

While descriptions have been provided above with the assumption that an Input/output unit is located above a fan box, the present invention is similarly applicable to cases in which an Input/output unit is located below a fan box instead of above. Further, a cooling mechanism of the present invention is applicable to operation processors that comprise, besides Input/output units, any given unit box that is located above or below a fan box, that has a heat generating body inside, and that requires cooling.

INDUSTRIAL APPLICABILITY

With respect to a server device, such as a blade server comprising an operation processing part, an Input/output unit, and a fan box for cooling, it is possible to attain high cooling performance without adding a fan box for cooling the Input/output unit.

The invention claimed is:

1. An operation processor comprising:
a fan box that has a built-in fan, that sucks in cooling wind from a first intake port provided in a front face, and that vents through an exhaust port in a rear face;
an operation unit disposed to the front of the fan box; and
a unit box disposed adjacent to the fan box and comprising a heat generating body inside, wherein
an air duct is provided, the air duct opening in a front face of the processor and leading to the unit box,
the fan box comprises a second intake port at a wall surface position upstream of the fan,
the unit box comprises an exhaust notch that is aligned with the second intake port, and an intake notch that is provided further to the rear than the exhaust notch and communicates with the air duct, and
the fan discharges through the exhaust port cooling wind that has flowed into the first intake port via the operation unit and cooling wind that has flowed into the second intake port via the unit box.

2. An operation processor according to claim 1, wherein the air duct is provided on both left and right sides of the operation unit.

3. An operation processor according to claim 1, wherein the intake notch is provided in a side wall of the unit box.

4. An operation processor according to claim 1, wherein the unit box is an Input/output unit.

5. An operation processor according to claim 1, wherein the air duct comprises means that regulates the area of an opening.

6. An operation processor according to claim 1, wherein the unit box is disposed to the side of the fan box.

7. An operation processor according to claim 1, wherein the unit box is disposed above or below the fan box.

* * * * *